United States Patent
Kubota et al.

(10) Patent No.: US 7,521,858 B2
(45) Date of Patent: Apr. 21, 2009

(54) ORGANIC EL DISPLAY AND METHOD OF MANUFACTURING THE SAME

(75) Inventors: Hirofumi Kubota, Kanazawa (JP); Norihisa Maeda, Ishikawa-gun (JP); Masuyuki Oota, Hakusan (JP); Kenji Mitsui, Hakusan (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 324 days.

(21) Appl. No.: 11/562,687

(22) Filed: Nov. 22, 2006

(65) Prior Publication Data

US 2007/0120474 A1 May 31, 2007

(30) Foreign Application Priority Data

Nov. 25, 2005 (JP) ............................. 2005-340219
Nov. 25, 2005 (JP) ............................. 2005-340220

(51) Int. Cl.
*H01J 1/62* (2006.01)
(52) U.S. Cl. ...................... 313/504; 313/506
(58) Field of Classification Search ................. 313/498, 313/504, 506
See application file for complete search history.

(56) References Cited

U.S. PATENT DOCUMENTS

| 7,075,230 | B2 * | 7/2006 | Chen ........................... 313/506 |
| 2001/0031379 | A1 * | 10/2001 | Tera et al. .................... 428/690 |
| 2006/0197440 | A1 | 9/2006 | Mitsui et al. |

FOREIGN PATENT DOCUMENTS

| JP | 2000-91067 | 3/2000 |
| JP | 2004-207000 | 7/2004 |
| JP | 2004-241188 | 8/2004 |

* cited by examiner

*Primary Examiner*—Vip Patel
(74) *Attorney, Agent, or Firm*—Oblon, Spivak, McClelland, Maier & Neustadt, P.C.

(57) ABSTRACT

An organic EL display includes a substrate, and organic EL elements arranged on the substrate. Each organic EL element includes an anode, a cathode, an emitting layer made of an organic material and interposed therebetween, and a hole transporting layer made of an organic material and interposed between the emitting layer and the anode. The hole transporting layer includes a first layer and a second layer facing the substrate with the first layer interposed therebetween. The second layer is equal in compositions with the first layer and different in degrees of crystallinity from the first layer.

21 Claims, 7 Drawing Sheets

ORGANIC EL DISPLAY AND METHOD OF MANUFACTURING THE SAME

CROSS-REFERENCE TO RELATED APPLICATIONS

This application is based upon and claims the benefit of priority from prior Japanese Patent Applications No. 2005-340219, filed Nov. 25, 2005; and No. 2005-340220, filed Nov. 25, 2005, the entire contents of both of which are incorporated herein by reference.

BACKGROUND OF THE INVENTION

1. Field of the Invention

The present invention relates to an organic electroluminescent (hereinafter referred to as EL) display and a method of manufacturing the same.

2. Description of the Related Art

Organic EL elements are essential parts of an organic EL display. The organic EL elements are required to achieve a higher luminance and a longer lifetime. For that, many techniques are proposed in order to respond the demands. For example, in JP-A 2004-241188 (KOKAI), a mixture of a luminescent material and a charge transporting material is used as a material of an emitting layer, and a concentration gradient of the luminescent material is formed in the emitting layer.

BRIEF SUMMARY OF THE INVENTION

An object of the present invention is to achieve a high-luminance and long-life organic EL element.

According to a first aspect of the present invention, there is provided an organic EL display comprising a substrate, and organic EL elements arranged on the substrate, each of the organic EL elements comprising an anode, a cathode, an emitting layer made of an organic material and interposed between the anode and the cathode, and a hole transporting layer made of an organic material and interposed between the emitting layer and the anode, the hole transporting layer including a first layer and a second layer facing the substrate with the first layer interposed therebetween, and the second layer being equal in compositions with the first layer and different in degrees of crystallinity from the first layer.

According to a second aspect of the invention, there is provided an organic EL display comprising a substrate, and organic EL elements arranged on the substrate, each of the organic EL elements comprising an anode, a cathode, an emitting layer made of an organic material and interposed between the anode and the cathode, and a hole transporting layer made of an organic material and interposed between the emitting layer and the anode, the hole transporting layer including a first layer and a second layer facing the substrate with the first layer interposed therebetween, and the second layer being equal in compositions with the first layer and different in hole mobility from the first layer.

According to a third aspect of the present invention, there is provided a method of manufacturing the organic EL display according to the first aspect, comprising in a period from starting a deposition of the first layer to starting a deposition of the second layer, decreasing a degree of crystallinity in the first layer.

According to a fourth aspect of the present invention, there is provided a method of manufacturing the organic EL display according to the first aspect, comprising in a period from starting a deposition of the first layer to starting a deposition of the second layer, expanding and contracting the substrate in an in-plane direction parallel to a main surface of the substrate or subjecting the substrate to a heat treatment.

DETAILED DESCRIPTION OF THE INVENTION

Figure 1:
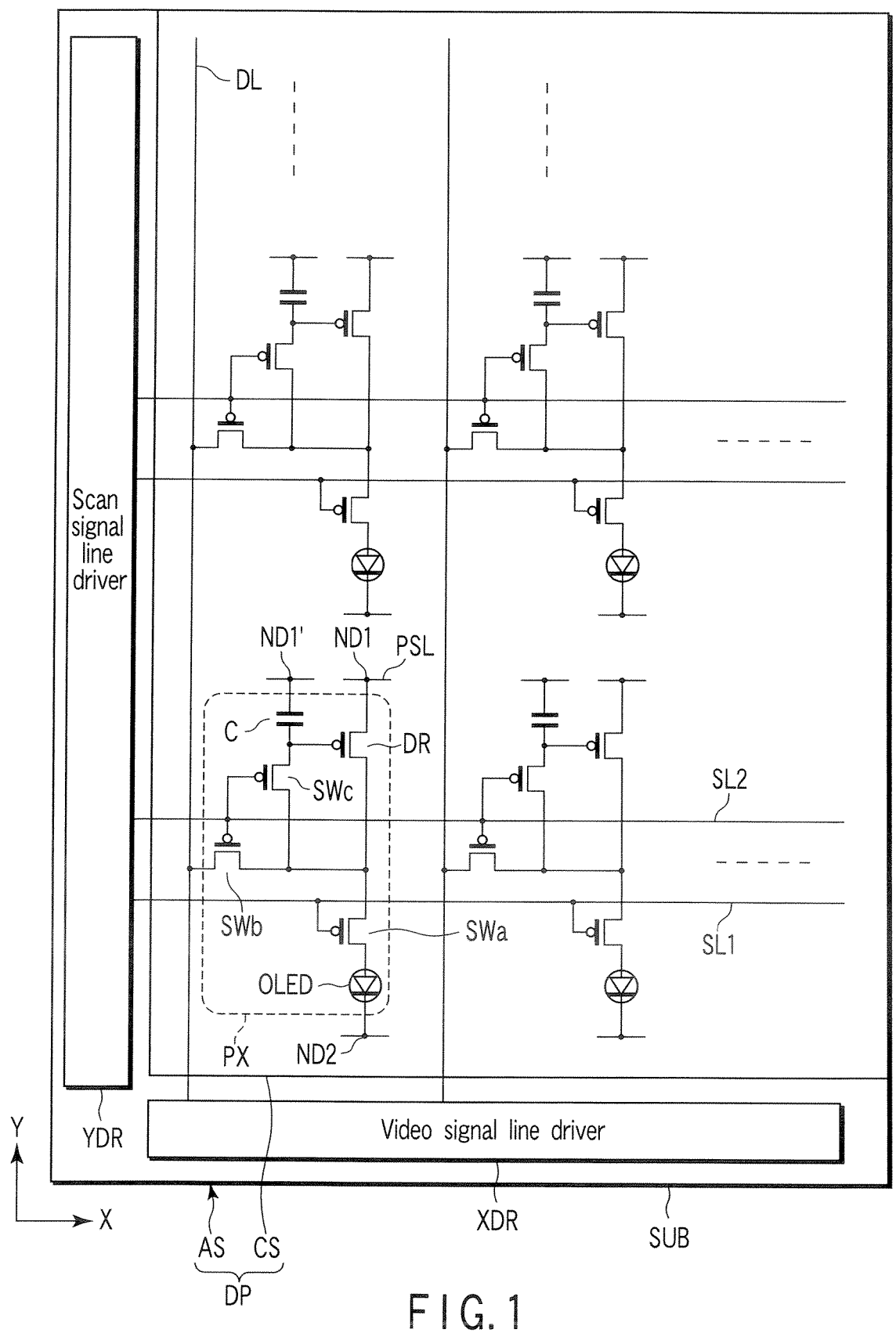
FIG. 1 is a plan view schematically showing a display according to a first embodiment of the present invention.

Embodiments of the present invention will be described below in detail with reference to the drawings. In the drawings, components having the same or similar function are denoted by the same reference symbol and duplicate descriptions will be omitted.

Figure 2:
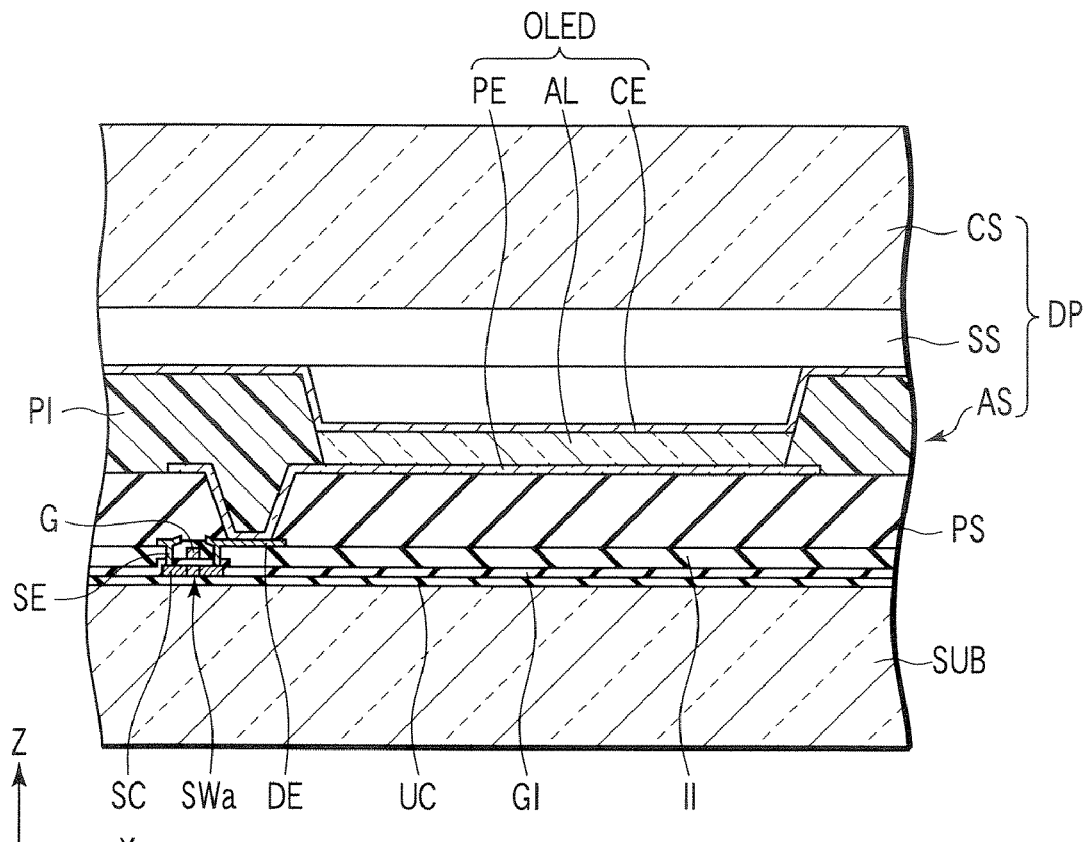
FIG. 2 is a sectional view showing an example of a structure that can be employed in the display shown in FIG. 1.

FIG. 1 is a plan view schematically showing a display according to a first embodiment of the present invention. FIG. 2 is a sectional view schematically showing an example of the structure that can be employed in the display shown in FIG. 1. In FIG. 2, the display is drawn such that its display surface, i.e., the front surface or light-emitting surface, faces downwardly and its back surface faces upwardly.

The display shown in FIGS. 1 and 2 is a bottom emission organic EL display that employs an active matrix driving method. The organic EL display includes a display panel DP, a video signal line driver XDR, and a scan signal line driver YDR.

The display panel DP includes an array substrate AS, a sealing substrate CS, and a sealing layer SS. The array substrate AS and the sealing substrate CS face each other. The sealing layer SS is frame-shaped and forms an enclosed space between the array substrate AS and the sealing substrate CS. The enclosed space is filled with inert gas.

The enclosed space may be filled with resin such as epoxy resin instead of inert gas. In this case, a barrier layer made of $SiN_x$, etc. may be formed on the counter electrode CE described later.

The array substrate AS includes an insulating substrate SUB such as glass substrate.

For example, an $SiN_x$ layer and an $SiO_x$ layer are sequentially stacked on the substrate SUB as an undercoat layer UC shown in FIG. 2.

Semiconductor layers SC such as polysilicon layers in each of which source and drain are formed, a gate insulator GI which may be formed by using tetraethyl orthosilicate (TEOS), and gates G which are made of, for example, MoW are sequentially stacked on the undercoat layer UC to form top gate-type thin-film transistors. In this embodiment, the thin-film transistors are p-channel thin-film transistors and utilized as drive control elements DR and switches SWa to SW3c shown in FIG. 1.

On the gate insulator GI, scan signal lines SL1 and SL2 shown in FIG. 1 and bottom electrodes (not shown) are further arranged. These components can be formed in the same process as that for forming the gates G.

As shown in FIG. 1, the scan signal lines SL1 and SL2 extend along the rows of the pixels PX, i.e., in an X direction, and are alternately arranged in a Y direction along the columns of the pixels PX. The scan signal lines SL1 and SL2 are connected to the scan signal line driver YDR.

The bottom electrodes are connected to the gates of the drive control elements DR. Each bottom electrode is utilized as an electrode of a capacitor C described later.

An interlayer insulating film II shown in FIG. 2 covers the gate insulator GI, gates G, scan signal lines SL1 and SL2, and bottom electrodes. The interlayer insulating film II is, for example, an $SiO_x$ film formed by plasma CVD. Parts of the interlayer insulating film II are utilized as dielectric layers of the capacitors C.

On the interlayer insulating film II, source electrodes SE and drain electrodes DE shown in FIG. 2, video signal lines DL and power supply lines PSL shown in FIG. 1, and top electrodes (not shown) are arranged. These components can be formed in the same process and may have a three-layer structure of, for example, Mo, Al, and Mo.

The source electrodes SE and drain electrodes DE are electrically connected to the sources and drains of the thin-film transistors via contact holes formed in the interlayer insulting film II.

As shown in FIG. 1, the video signal lines DL extend in the Y direction and are arranged in the X direction. An end of each video signal line DL is connected to a video signal line driver XDR.

As an example, the power supply lines PSL extend in the Y direction and are arranged in the X direction. For example, the power supply lines PSL are connected to the video signal line driver XDR.

The top electrodes are connected to the power supply lines PSL. Each top electrode is utilized as another electrode of the capacitor C.

A passivation film PS covers the source electrodes SE, drain electrodes DE, video signal lines DL, power supply lines PSL, and top electrodes. The passivation film PS is made of, for example, $SiN_x$.

Pixel electrodes PE are arranged on the passivation film PS. In the present embodiment, the pixel electrodes PE are light-transmissible anode as front electrodes. Each pixel electrode PE is connected through a through-hole formed in the passivation film PS to the drain electrode DE to which the drain of the switch SWa is connected.

An insulating partition layer PI shown in FIG. 2 is further placed on the passivation film PS. The insulating partition layer PI has through-holes formed at positions corresponding to the pixel electrodes PE or slits formed at positions corresponding to columns or rows formed by the pixel electrodes PE. Here, by way of example, the insulating partition layer PI has through-holes formed at positions corresponding to the pixel electrodes PE.

The insulating partition layer PI is, for example, an organic insulating layer. The insulating partition layer PI can be formed using, for example, a photolithography technique.

An active layer AL is placed on each of the pixel electrode PE. The active layer AL includes an emitting layer and a hole transporting layer.

The insulating partition layer PI and the active layers AL are covered with a counter electrode CE as a back electrode. The second electrode CE is a common electrode shared among the pixels PX. In this embodiment, the second electrode CE is a light-reflective cathode. For example, an electrode wire (not shown) is formed on the layer on which the video signal lines DL are formed, and the counter electrode CE is electrically connected to the electrode wire via a contact hole formed in the passivation film PS and insulating partition layer PI. Each organic EL element OLED includes the pixel electrode PE, active layer AL, and counter electrode CE. The details of the organic EL elements will be described later.

In the present embodiment, each pixel circuit of the pixels PX includes the drive control element (drive transistor) DR, output control switch SWa, selector switch SWb, diode-connecting switch SWc, and capacitor C. As described above, the drive control element DR and switches SWa to SWc are p-channel thin-film transistors in this embodiment. Also, in this embodiment, the selector switch SWb and diode-connecting switch SWc form a switch group which switches between a first state that the drain and gate of the drive control element DR and the video signal line Dl are connected to one another and a second state that they are disconnected from one another.

The drive control element DR, output control switch SWa, and organic EL element OLED are connected in series between a first power supply terminal ND1 and second power supply terminal ND2 in this order. In this embodiment, the first power supply terminal ND1 is a high-potential power supply terminal, and the second power supply terminal ND2 is a low-potential power supply terminal.

The gate of the output control switch SWa is connected to the scan signal line SL1. The selector switch SWb is connected between the video signal line DL ad the drain of the drive control element DR. The gate of the switch SWb is connected to the scan signal line SL2. The diode-connecting switch SWc is connected between the drain and gate of the drive control element DR. The gate of the switch SWc is connected to the scan signal line SL2.

The capacitor C is connected between the gate of the drive control element DR and a constant-potential terminal ND1'. As an example, the constant-potential terminal ND1' is connected to the first power supply terminal ND1.

The video signal line driver XDR and scan signal line driver YDR are placed on the array substrate AS in this embodiment. That is, the video signal line driver XDR and scan signal line driver YDR are mounted by chip-on-glass (COG) in the present embodiment. The video signal line driver XDR and scan signal line driver YDR may be mounted by tape carrier package (TCP) instead.

When an image is to be displayed on the organic EL display, both the scan signal lines SL1 and the scan signal lines SL2 are driven sequentially, for example. In a write period for writing video signals on pixels PX in a certain row, the scan signal line driver YDR outputs a scan signal for opening (or switching off) the switches SWa as a voltage signal to the scan signal line SL1 to which the pixels PX are connected, and subsequently, outputs a scan signal for closing (or switching on) the switches SWb and SWc as a voltage signal to the scan signal line SL2 to which the pixels PX are connected. In this state, the video signal line driver XDR outputs video signals as current signals to the video signal lines DL to which the pixels PX are connected, so as to set the gate-to-source voltage of each drive control element DR at a value corresponding to the magnitude of the video signal. Then, the scan signal line driver YDR outputs a scan signal for opening (or switching off) the switches SWb and SWc as a voltage signal to the scan signal line SL2 to which the pixels PX are connected, and subsequently, outputs a scan signal for closing (or switching on) the switches SWa as a voltage signal to the scan signal line SL1 to which the pixels are connected.

During an effective display period over which the switch SWa is closed (or switched on), a drive current flows through the organic EL element OLED at magnitude corresponding to the gate-to-source voltage of the drive control element DR. The organic EL element OLED emits light at luminance corresponding to the magnitude of the drive current.

Figure 3:
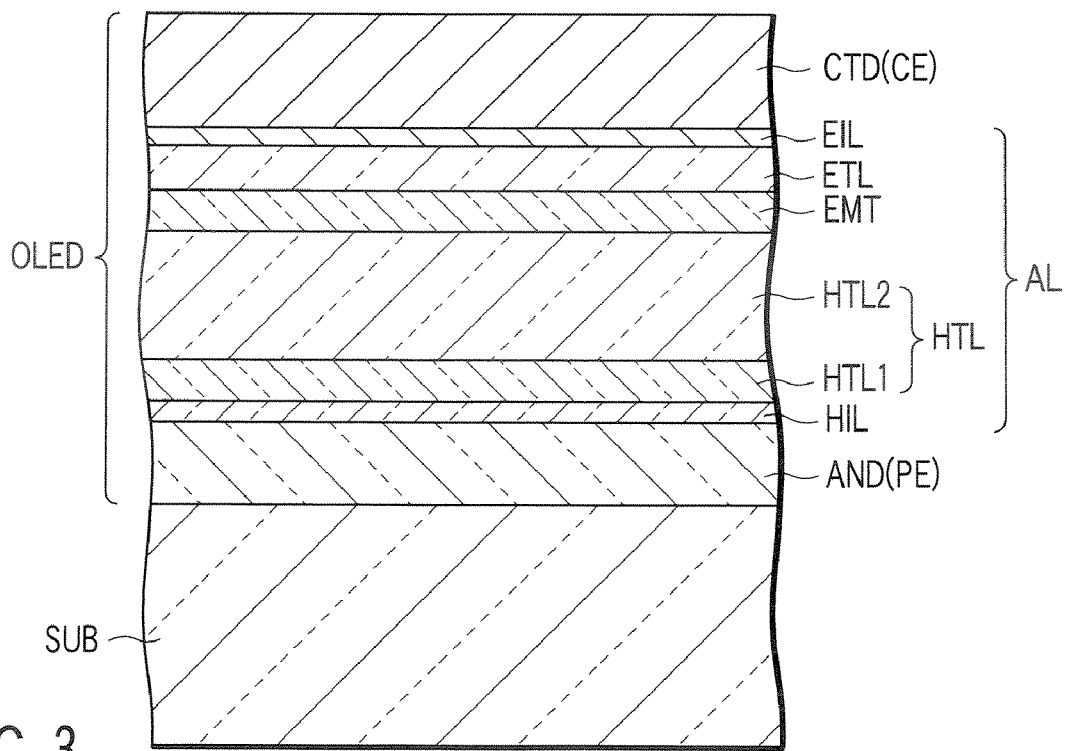
FIG. 3 is an enlarged sectional view showing a part of the structure shown in FIG. 2.

FIG. 3 is an enlarged sectional view showing a part of the structure shown in FIG. 2. In FIG. 3, only the substrate SUB and the organic EL element OLED are depicted and other components are omitted.

The organic EL element OLED includes an anode AND, cathode CTD, emitting layer EMT, hole transporting layer HTL, hole injection layer HIL, electron transporting layer ETL, and electron injection layer EIL. In this example, the pixel electrode PE and counter electrode CE shown in FIG. 2 correspond to the anode AND and cathode CTD in FIG. 3, respectively. Also, in this example, the active layer AL corresponds to the laminate of the hole injection layer HIL, hole transporting layer HTL, emitting layer EMT, electron transporting layer ETL, and electron injection layer EIL. The organic EL element OLED may further include a hole blocking layer, etc.

The anode AND and cathode CTD face each other. The anode AND and cathode CTD are made of inorganic material, for example. Typically, the anode AND is larger in work function than the cathode CTD. As a material of the anode AND, indium tin oxide (ITO) is used, for example. As a material of the cathode CTD, aluminum is used, for example.

The emitting layer EMT is interposed between the anode AND and cathode CTD. The emitting layer EMT is an organic layer and made of a mixture containing a host material and a dopant, for example. As the host material, tris(8-hydroxyquinolinato)aluminum ($Alq_3$) and the like may be used. As the dopant, coumarin and the like may be used.

The hole transporting layer is interposed between the anode AND and emitting layer EMT. The hole transporting layer HTL is made of organic material, and typically, has an ionization energy between the work function of the anode AND and the ionization energy of the emitting layer EMT.

The hole transporting layer HTL includes organic layers differing in hole mobility from each other. In FIG. 3, the hole transporting layer HTL includes a first layer HTL1 and a second layer HTL2.

Typically, the first layer HTL1 and second layer HTL2 are equal in compositions to each other and made of organic material.

As materials of the layers HTL1 and HTL2, N,N'-diphenyl-N,N'-bis(3-methylphenyl)-1,1'-biphenyl-4,4'-diamine (TPD) or N,N'-diphenyl-N,N'-bis(1-napthylphenyl)-1,1'-biphenyl-4,4'-diamine (α-NPD) is used, for example.

Typically, the first layer HTL1 and second layer HTL2 are different in degrees of crystallinity from each other. For example, the first layer HTL1 is lower in degrees of crystallinity than the second layer HTL1. When the layers HTL1 and HTL2 is equals in composition to each other and the layer HTL1 is lower in degrees of crystallinity than the layer HTL2, the layer HTL1 has a hole mobility lower than that of the layer HTL2.

The hole injection layer HIL is interposed between the anode AND and hole transporting layer HTL. The hole injection layer HIL is made of organic material, inorganic material, or organometallic compound, and typically has an ionization energy between the work function of the anode AND and the ionization energy of the hole transporting layer HTL. As a material of the hole injection layer HIL, copper phthalocyanine (CuPc) is used, for example.

The electron transporting layer ETL is interposed between the emitting layer EMT and cathode CTD. The electron transporting layer ETL is made of organic material, for example. Typically, the electron transporting layer ETL has an electron affinity between the electron affinity of the emitting layer EMT and the work function of the cathode CTD. As a material of the electron transporting layer ETL, $Alq_3$ is used, for example.

The electron injection layer EIL is interposed between the electron transporting layer ETL and cathode CTD. The electron injection layer EIL is made of organic material, inorganic material, or organometallic compound. Typically the electron injection layer EIL has an electron affinity between the electron affinity of the electron transporting layer ETL and the work function of the cathode CTD. As a material of the electron injection layer EIL, lithium fluoride is used, for example.

The organic EL display can be manufactured, for example, by the following method.

First, the undercoat layer UC, insulating partition layer PI, and components interposed therebetween are formed on the insulating substrate SUB.

Next, the hole injection layer HIL and layer HTL1 are formed on the anode AND in this order. For example, vacuum evaporation is used for forming the hole injection layer HIL and layer HTL1.

Subsequently, the layer HTL1 is subjected to a treatment that lowers the degree of crystallinity in the layer HTL1. For example, the substrate SUB is subjected to a heat treatment.

If the substrate SUB, anode AND, etc. are sufficiently larger in coefficient of linear expansion than the layer HTL1, tension is applied to the layer HTL1 in the in-plane direction when the substrate SUB is heated. Consequently, fine cracks are formed in the layer HTL1 and its degree of crystallinity lowers.

The degree of crystallinity in the layer HTL1 may be lowered by other methods. For example, the degree of crystallinity in the layer HTL1 may be lowered by stretching the peripheries of the substrate SUB in the in-plane direction. Note that the cracks in the layer HTL1 may be or may not be filled with the layer HTL2.

After lowering the degree of crystallinity in the layer HTL1, the layer HTL2, emitting layer EMT, electron transporting layer ETL, electron injection layer EIL, and cathode CTD are formed on the layer HTL1 in this order. These components are formed by vacuum evaporation, for example.

Thus, the array substrate AS is completed. Note that from starting the deposition of the hole injection layer HIL until finishing the deposition of the cathode CTD, all the processes are carried out in vacuum.

Then, a flame-shaped adhesive layer to be used as the sealing layer SS is formed on the sealing substrate CS. Subsequently, the array substrate AS and sealing substrate CS are bonded together such that the cathode CTD and sealing substrate CS face each other and the adhesive layer is interposed between the array substrate AS and sealing substrate. Thereafter, the adhesive layer is cured, so as to complete the organic EL display.

In order to improve luminous efficiency, it is important to optimize carrier balance of electrons and holes in the emitting layer. However, hole mobility of materials generally used for a hole transporting layer is greater than electron mobility of materials generally used for an electron transporting layer by an order of magnitude. In addition, development of a material achieving a desired mobility is very difficult. For these reasons, conventional organic EL displays cannot achieve an optimum carrier balance in an emitting layer a sufficient luminous efficiency.

In the present embodiment, the hole transporting layer including the layer HTL1 with a low degree of crystallinity is used. When a layer included in the hole transporting layer HTL is lowered, the hole mobility of the hole transporting layer HTL is lowered. Thus, according to the present embodiment, the carrier balance of electrons and holes can be optimized in the emitting layer EMT, and therefore, a sufficient luminous efficiency can be achieved.

The organic EL element OLED with a high luminous efficiency can emit light at high luminance even when the voltage applied between the anode AND and cathode CTD is low. Therefore, according to the present embodiment, it is possible to achieve a high-luminance and long-life organic EL element.

The hole transporting layer HTL also includes the layer HTL2 higher in degrees of crystallinity than the layer HTL1. Thus, a ratio $d_2/d_1$ of the thickness $d_2$ of the layer HTL2 to the thickness $d_1$ of the layer HTL1 can be used as a parameter for setting the hole mobility of the hole transporting layer HTL at a desired value.

In addition, the layer HTL2 with a higher degree of crystallinity is placed between the emitting layer EMT and the layer HTL1 with a lower degree of crystallinity. Thus, when impurities are attached to the layer HTL1 during the process for lowering the degree of crystallinity in the layer HTL1, diffusion of the impurities into the emitting layer EMT can be prevented. Therefore, according to the present embodiment, deterioration of the organic EL element OLED due to the diffusion of impurities into the emitting layer EMT can be suppressed.

Typically, the layers HTL1 and HTL2 are equal in compositions to each other. When such a structure is employed, properties other than hole mobility of the hole transporting layer HTL that includes the layers HTL1 and HTL2 can be equal to properties other than hole mobility of the hole transporting layer HTL that includes only the layer HTL2. That is, when the layers HTL1 and HTL2 are equal in compositions to each other, design changes due to addition of the layer HTL1 are unnecessary or nominal.

Also, when the layers HTL1 and HTL2 are equal in compositions to each other, the layers HTL1 and HTL2 can be formed in a single deposition apparatus. Therefore, when the layers HTL1 and HTL2 are equal in compositions to each other, the cost of equipment can be decreased, and manufacture can be facilitated.

The ratio $\mu_2/\mu_1$ of the hole mobility $\mu_2$ in the layer HTL2 to the hole mobility $\mu_1$ in the layer HTL1 may be set a range from 4 to 20, for example. When the ratio $\mu_2/\mu_1$ is small, the effect of increasing luminance efficiency is small. On the other hand, a large ratio $\mu_2/\mu_1$ is difficult to achieve.

The ratio $d_2/d_1$ of the thickness $d_2$ of the layer HTL2 to the thickness $d_1$ of the layer HTL1 is set, for example, equal to or less than 7, and typically equal to or less than 3. When the ratio $d_2/d_1$ is large, the effect of increasing luminance efficiency is small. The ratio $d_2/d_1$ is set, for example, equal to or more than 1, and typically equal to or more than 1.1. When the ratio $d_2/d_1$ is small, the effect of preventing impurities from diffusing from the layer HTL1 into the emitting layer EMT is small.

The second embodiment of the present embodiment is described below.

Figure 4:
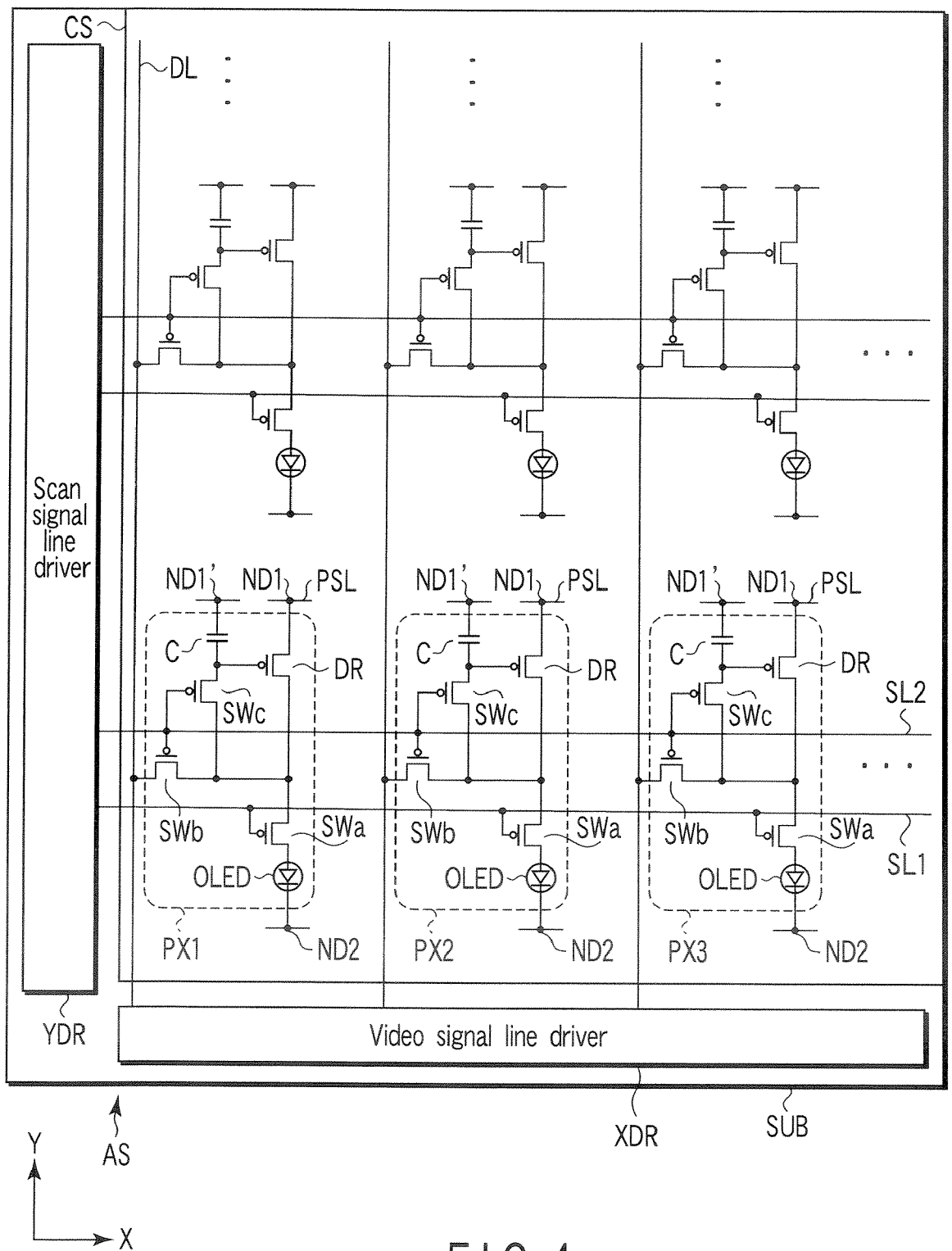
FIG. 4 is a plan view schematically showing a display according to a second embodiment of the present invention.
Figure 5:
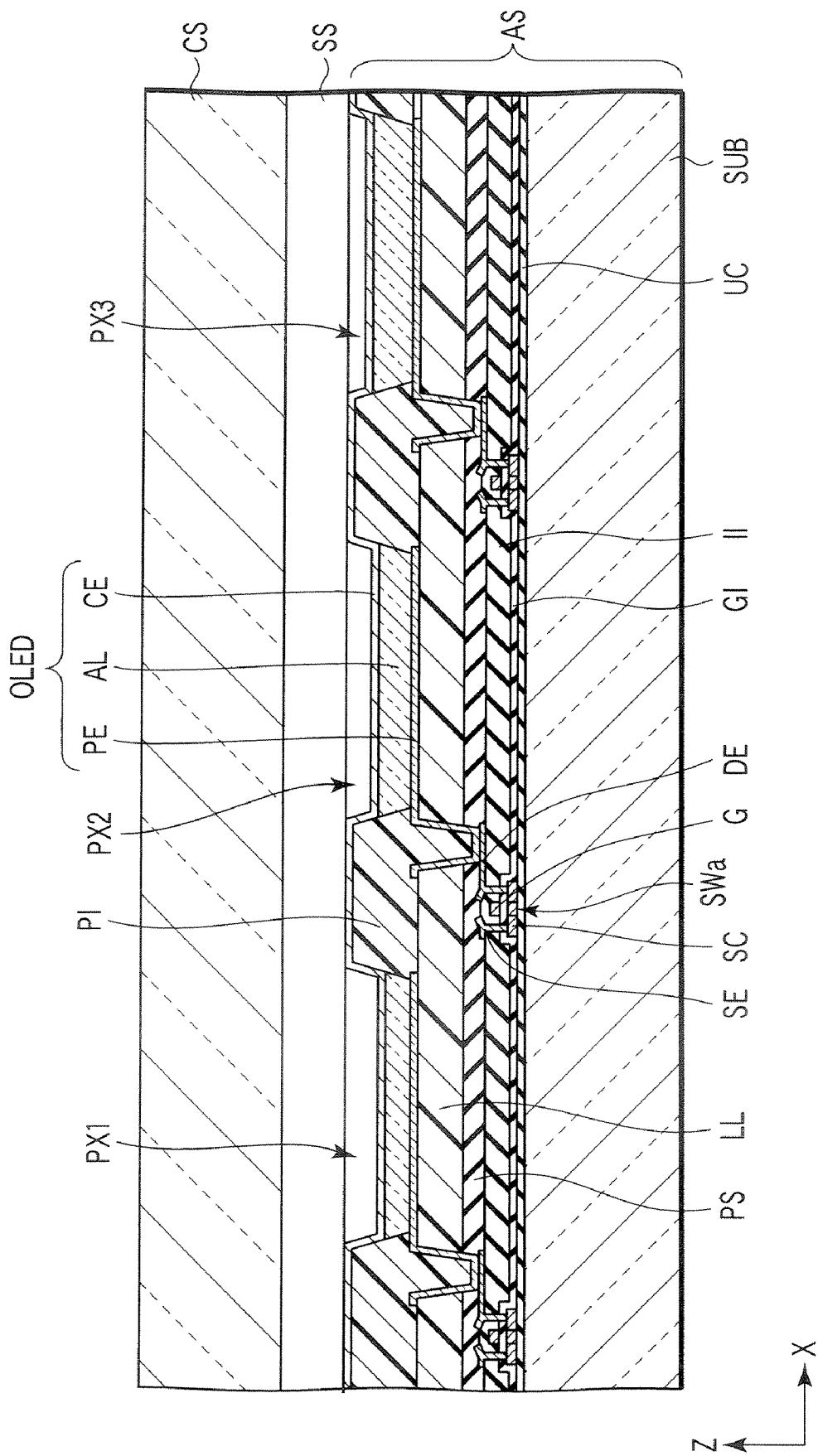
FIG. 5 is a sectional view showing an example of a structure that can be employed in the display shown in FIG. 4.

FIG. 4 is a plan view schematically showing a display according to a second embodiment of the present invention. FIG. 5 is a sectional view showing an example of a structure that can be employed in the display shown in FIG. 4. In FIG. 5, the display is drawn such that its display surface, i.e., the front surface or light-emitting surface, faces downwardly and its back surface faces upwardly.

The display shown in FIGS. 4 and 5 is a bottom emission organic EL display that employs an active matrix driving method. The organic EL display is the same as the organic EL display described with reference to FIGS. 1 and 2 except that the following structure is employed.

That is, the display shown in FIGS. 4 and 5 include pixels PX1 to PX3 differing in display colors from one another instead of the pixels PX shown in FIG. 1. The pixels PX1 to PX3 have almost the same structure as those of the pixels PX.

In addition, the display shown in FIGS. 4 and 5 further includes a leveling layer LL interposed between the passivation layer PS and the pixel electrodes PE and between the passivation layer PS and the insulating partition layer PI. The leveling layer LL is made of hard resin, for example.

In this display, each organic EL element OLED forms an optical resonator, i.e., microcavity structure. In this embodiment, the structure that multi-beam interference of light emitted by the active layer AL occurs between the leveling layer LL and the counter electrode CE.

The organic EL element OLED of the pixel PX1 is shorter in optical lengths between the leveling layer LL and the counter electrode CE than the organic EL element OLED of the pixel PX2. The organic EL element OLED of the pixel PX3 is longer in optical lengths between the leveling layer LL and the counter electrode CE than the organic EL element OLED of the pixel PX2. Here, as an example, the optical lengths are made different by changing the thicknesses of the hole transporting layers among the pixels PX1 to PX3.

In this example, the pixel PX1 is longer than the pixel PX3 in wavelength $\lambda_{res}$ of light with the maximum intensity that the organic EL element OLED emits in the normal direction. Also, in this example, the pixel PX2 is shorter than the pixel PX3 in wavelength $\lambda_{res}$ of light with the maximum intensity that the organic EL element OLED emits in the normal direction. For example, the wavelength $\lambda_{res}$ of light emitted by the organic EL element OLED of the pixel PX1 falls within the wavelength range of red color, the wavelength $\lambda_{res}$ of light emitted by the organic EL element OLED of the pixel PX2 falls within the wavelength range of blue color, and the wavelength $\lambda_{res}$ of light emitted by the organic EL element OLED of the pixel PX1 falls within the wavelength range of green color.

The organic EL display employs the following structure in the organic EL elements OLED.

Figure 6:
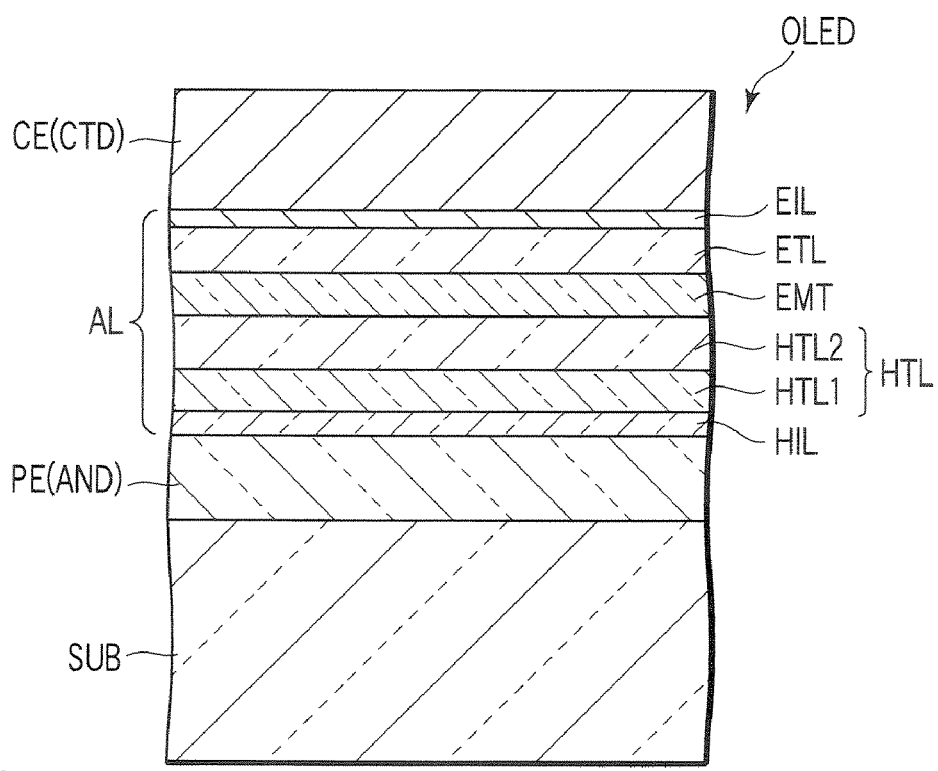
FIG. 6 is an enlarged sectional view showing a part of the structure shown in FIG. 5.
Figure 7:
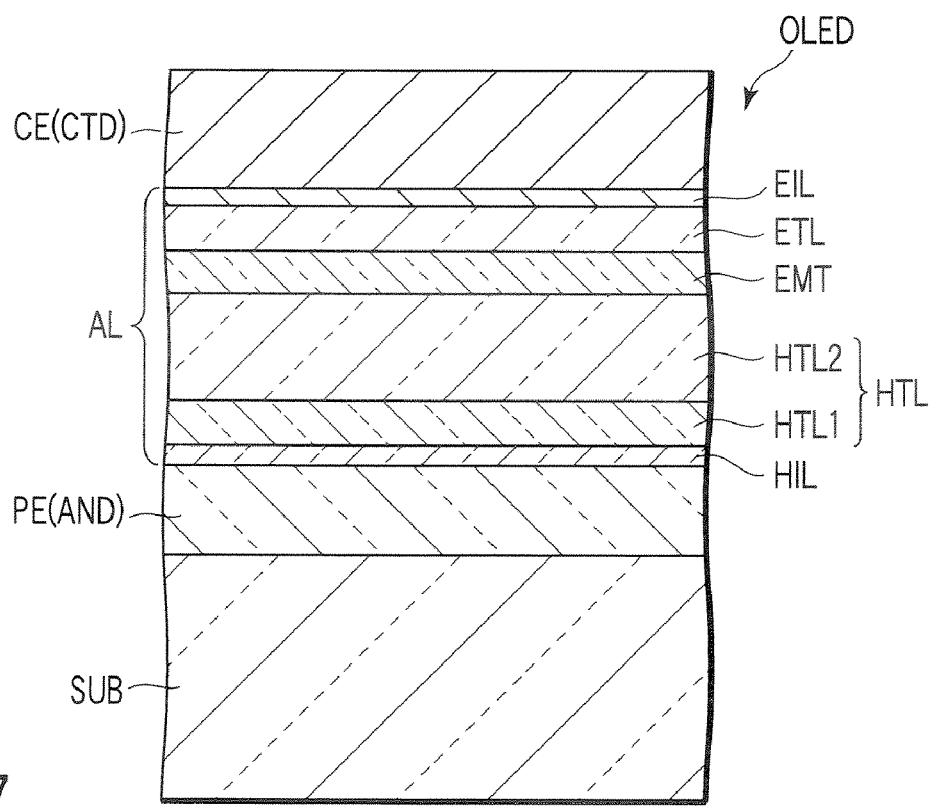
FIG. 7 is an enlarged sectional view showing another part of the structure shown in FIG. 5.
Figure 8:
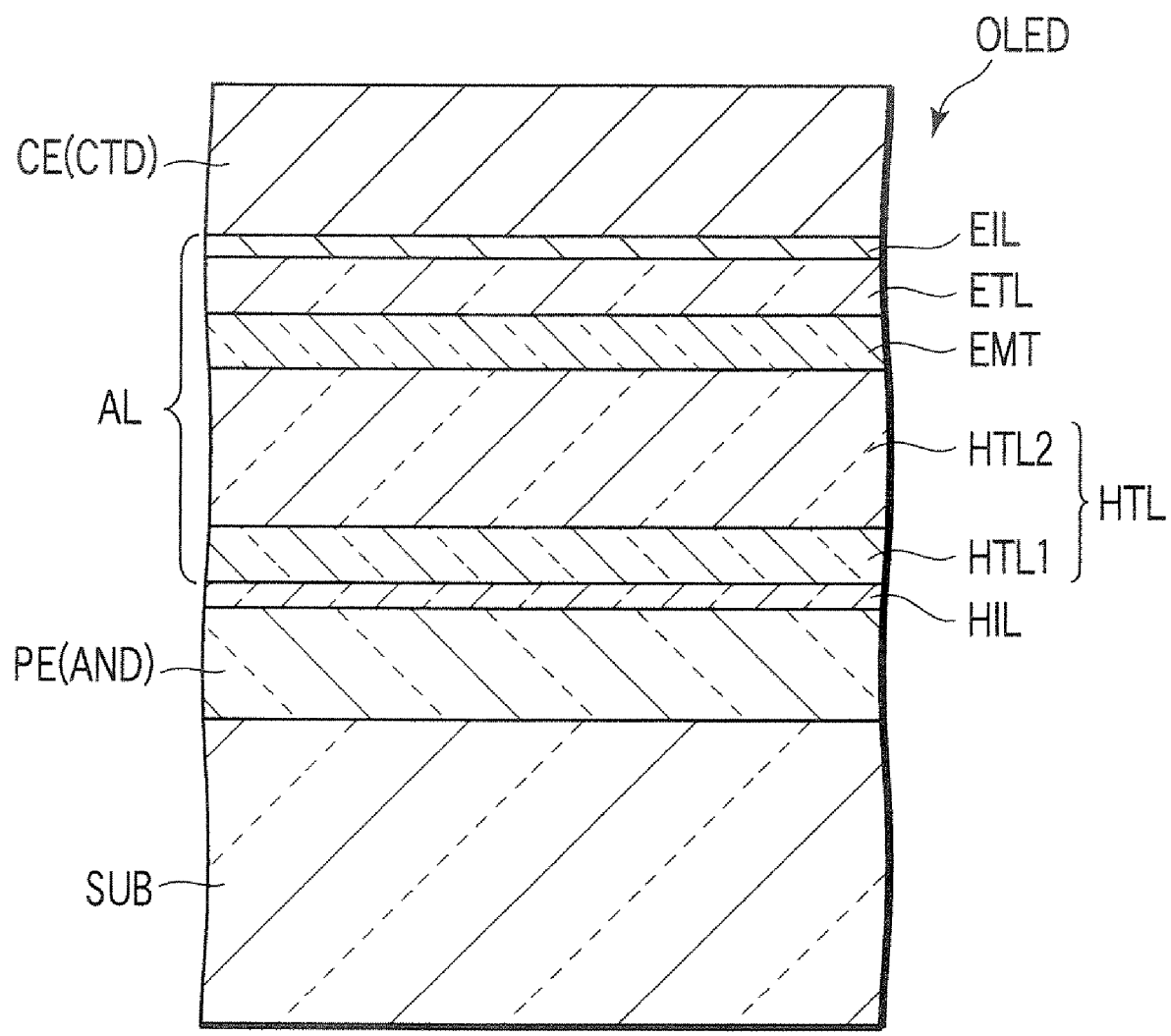
FIG. 8 is an enlarged sectional view showing still another part of the structure shown in FIG. 5.

FIGS. 6 to 8 are enlarged sectional views showing parts of the structure shown in FIG. 5. Specifically, FIG. 6 shows the organic EL element OLED of the pixel PX1, FIG. 7 shows the organic EL element OLED of the pixel PX2, and FIG. 8 shows the organic EL element OLED of the pixel PX3. Note that in FIGS. 6 to 8, only the substrate SUB and the organic EL elements OLED are depicted and other components are omitted.

Similarly to the pixel PX shown in FIG. 3, the pixels PX1 to PX3 shown in FIGS. 6 to 8 include an anode AND, cathode CTD, emitting layer EMT, hole transporting layer HTL, hole injection layer HIL, electron transporting layer ETL, and electron injection layer EIL. In this example, the pixel electrode PE and counter electrode CE shown in FIG. 5 correspond to the anode AND and cathode CTD in FIGS. 6 to 8, respectively. Also, in this example, the active layer AL shown in FIG. 5 corresponds to the laminate of the hole injection layer HIL, hole transporting layer HTL, emitting layer EMT, electron transporting layer ETL, and electron injection layer EIL shown in FIGS. 6 to 8. The organic EL element OLED may further include a hole blocking layer, etc.

The anode AND and cathode CTD face each other. The anode AND and cathode CTD are made of inorganic material, for example. Typically, the anode AND is larger in work function than the cathode CTD. As a material of the anode AND, ITO is used, for example. As a material of the cathode CTD, aluminum is used, for example.

The emitting layer EMT is interposed between the anode AND and cathode CTD. The emitting layer EMT is an organic layer and made of a mixture containing a host material and a dopant, for example. As the host material, $Alq_3$ and the like may be used. As the dopant, coumarin and the like may be used. The emitting layers EMT of the pixels PX1 to PX3 differ in compositions or differ in compositions and thickness from one another.

The hole transporting layer is interposed between the anode AND and emitting layer EMT. The hole transporting layer HTL is made of organic material, and typically, has an ionization energy between the work function of the anode AND and the ionization energy of the emitting layer EMT.

The hole transporting layer HTL includes organic layers differing in hole mobility from each other. In FIG. 3, the hole transporting layer HTL includes a first layer HTL1 and a second layer HTL2.

Typically, the first layers HTL1 of the pixels PX1 to PX3 are equal in degrees of crystallinity and compositions to one another, and the second layers HTL2 of the pixels PX1 to PX3 are equal in degrees of crystallinity and compositions to one another. Typically, in each of the pixels PX1 to PX3, the first layer HTL1 and the second layer HTL2 are equal in compositions to each other and different in degrees of crystallinity or hole mobility from each other. As materials of the layers HTL1 and HTL2, TPD or α-NPD is used, for example.

The hole injection layer HIL is interposed between the anode AND and hole transporting layer HTL. The hole injection layer HIL is made of organic material, inorganic material, or organometallic compound, and typically has an ionization energy between the work function of the anode AND and the ionization energy of the hole transporting layer HTL. As a material of the hole injection layer HIL, CuPc is used, for example.

The electron transporting layer ETL is interposed between the emitting layer EMT and cathode CTD. The electron transporting layer ETL is made of organic material, for example. Typically, the electron transporting layer ETL has an electron affinity between the electron affinity of the emitting layer EMT and the work function of the cathode CTD. As a material of the electron transporting layer ETL, $Alq_3$ is used, for example.

The electron injection layer EIL is interposed between the electron transporting layer ETL and cathode CTD. The electron injection layer EIL is made of organic material, inorganic material, or organometallic compound. Typically the electron injection layer EIL has an electron affinity between the electron affinity of the electron transporting layer ETL and the work function of the cathode CTD. As a material of the electron injection layer EIL, lithium fluoride is used, for example.

The organic EL display can be manufactured, for example, by the following method.

First, the undercoat layer UC, insulating partition layer PI, and components interposed therebetween are formed on the insulating substrate SUB.

Next, the hole injection layer HIL and layer HTL1 are formed on the anode AND in this order. For example, vacuum evaporation is used for forming the hole injection layer HIL and layer HTL1.

Subsequently, the degree of crystallinity or hole mobility in the layer HTL1 is lowered. For example, the substrate SUB is subjected to a heat treatment.

Normally, the layer HTL1 just after the deposition is amorphous. When it is subjected to an appropriate heat treatment, the layer HTL1 becomes polycrystal or microcrystal. That is, the heat treatment produces many grain boundaries in the layer HTL1. Note that after completing the manufacture of the display panel DP, the degrees of crystallinity in the layers HTL1 and HTL2 can be evaluate by the following method, for example. First, the sealing substrate CS is removed from the array substrate AS. Subsequently, the layers HTL1 and HTL2 are obliquely cut to expose their cross sections. Thereafter, the cross sections are analyzed by utilizing X-ray diffraction or Raman scattering.

If the substrate SUB, anode AND, etc. are sufficiently larger in coefficients of linear expansion than the layer HTL1, tension is applied to the layer HTL1 in the in-plane direction when the substrate SUB is heated. Consequently, fine cracks are formed in the layer HTL1.

The grain boundaries and cracks hinder the movement of holes in the layer HTL1. Therefore, by subjecting the substrate SUB to an appropriate heat treatment, the hole mobility in the layer HTL1 becomes smaller than that before the heat treatment.

The degree of crystallinity in the layer HTL1 may be lowered by other methods. For example, the degree of crystallinity in the layer HTL1 may be lowered by stretching the peripheries of the substrate SUB in the in-plane direction. Note that the cracks in the layer HTL1 may be or may not be filled with the layer HTL2.

After lowering the degree of crystallinity in the layer HTL1, the layer HTL2, emitting layer EMT, electron transporting layer ETL, electron injection layer EIL, and cathode CTD are formed on the layer HTL1 in this order. These components are formed by vacuum evaporation, for example.

Thus, the array substrate AS is completed. Note that from starting the deposition of the hole injection layer HIL until finishing the deposition of the cathode CTD, all the processes are carried out in vacuum.

Then, a flame-shaped adhesive layer to be used as the sealing layer SS is formed on the sealing substrate CS. Subsequently, the array substrate AS and sealing substrate CS are bonded together such that the cathode CTD and sealing substrate CS face each other and the adhesive layer is interposed between the array substrate AS and sealing substrate. Thereafter, the adhesive layer is cured, so as to complete the organic EL display.

In order to improve luminous efficiency, it is important to optimize carrier balance of electrons and holes in the emitting layer. However, hole mobility of materials generally used for a hole transporting layer is greater than electron mobility of materials generally used for an electron transporting layer by an order of magnitude. In addition, development of a material achieving a desired mobility is very difficult. For these reasons, conventional organic EL displays cannot achieve an optimum carrier balance in an emitting layer a sufficient luminous efficiency.

In the present embodiment, many interfaces are produced in the layer HTL1 of the hole transporting layer HTL, so as to lower the hole mobility in the hole transporting layer HTL. Thus, according to the present embodiment, the carrier balance of electrons and holes can be optimized in the emitting layer EMT, and therefore, a sufficient luminous efficiency can be achieved.

The organic EL element OLED with a high luminous efficiency can emit light at high luminance even when the voltage applied between the anode AND and cathode CTD is low. Therefore, according to the present embodiment, it is possible to achieve a high-luminance and long-life organic EL element.

The hole transporting layer HTL also includes the layer HTL2 higher in degrees of crystallinity than the layer HTL1. Thus, a ratio $d_2/d_1$ of the thickness $d_2$ of the layer HTL2 to the thickness $d_1$ of the layer HTL1 can be used as a parameter for setting the hole mobility of the hole transporting layer HTL at a desired value.

In addition, the layer HTL2 subjected to a heat treatment is placed between the emitting layer EMT and the layer HTL1 not subjected to a heat treatment. Thus, when impurities are attached to the layer HTL1 during the heat treatment for the layer HTL1, diffusion of the impurities into the emitting layer EMT can be prevented. Therefore, according to the present embodiment, deterioration of the organic EL element OLED due to the diffusion of impurities into the emitting layer EMT can be suppressed.

Typically, the layers HTL1 and HTL2 are equal in compositions to each other. When such a structure is employed, properties other than hole mobility of the hole transporting layer HTL that includes the layers HTL1 and HTL2 can be equal to properties other than hole mobility of the hole transporting layer HTL that includes only the layer HTL2. That is, when the layers HTL1 and HTL2 are equal in compositions to each other, design changes due to addition of the layer HTL1 are unnecessary or nominal.

Also, when the layers HTL1 and HTL2 are equal in compositions to each other, the layers HTL1 and HTL2 can be formed in a single deposition apparatus. Therefore, when the layers HTL1 and HTL2 are equal in compositions to each other, the cost of equipment can be decreased, and manufacture can be facilitated.

As described above, the organic EL display employs the structure that multi-beam interference of light emitted by the active layer AL occurs between the leveling layer LL and the counter electrode CE. In addition, in the organic EL display, the thicknesses of the hole transporting layers are changed among the pixels PX1 to PX3 in order to make the wavelengths of light with the maximum intensity, e.g. resonant wavelengths that the organic EL elements OLED of the pixels PX1 to PX3 emit in the normal direction differ from one another.

The optimum heat treatment condition for the layer HTL1 depends on the thickness of the layer HTL1. For this reason, when each hole transporting layer HTL includes only the layer HTL1 and the thicknesses of the layers HTL1 are changed among the pixels PX1 to PX3, a certain heat treatment condition optimum for the layer HTL1 of the pixel PX2 is not always optimum for the layers HTL1 of the pixels PX1 and PX3. When the heat treatment cannot be carried out under the optimum condition, it is possible that the hole mobility is not be sufficiently lowered or the thickness of the layer HTL1 becomes uneven due to melting of the layer HTL1.

In the present embodiment, the pixels PX1 to PX3 are equal in the thicknesses of the layers HTL1 to one another and differ in the thicknesses of the layers HTL2 from one another. When the pixels PX1 to PX3 are equal in the thicknesses of the layers HTL1 to one another, the heat treatment can be carried out under the optimum conditions for the layers HTL1 of the pixels PX1 to PX3. In addition, since the thicknesses of the layer HTL2 of the pixels PX1 to PX3 can be freely set independently of the heat treatment, optical properties of the organic EL elements can be designed easily. Therefore, according to the present embodiment, it is easy to achieve high-luminance and long-life organic EL elements OLED in all the pixels PX1 to PX3.

The ratio $\mu_2/\mu_1$ of the hole mobility $\mu_2$ in the layer HTL2 to the hole mobility $\mu_1$ in the layer HTL1 may be set a range from 4 to 20, for example. When the ratio $\mu_2/\mu_1$ is small, the effect of increasing luminance efficiency is small. On the other hand, a large ratio $\mu_2/\mu_1$ is difficult to achieve.

The ratio $d_2/d_1$ of the thickness $d_2$ of the layer HTL2 to the thickness $d_1$ of the layer HTL1 is set, for example, equal to or less than 7, and typically equal to or less than 3. When the ratio $d_2/d_1$ is large, the effect of increasing luminance efficiency is small. The ratio $d_2/d_1$ is set, for example, equal to or more than 1, and typically equal to or more than 1.1. When the ratio $d_2/d_1$ is small, the effect of preventing impurities from diffusing from the layer HTL1 into the emitting layer EMT is small.

In the first and second embodiments, the first layer HTL1 is lower in degrees of crystallinity than the second layer HTL2. The first layer HTL1 may be higher in degrees of crystallinity than the second layer HTL2.

For example, this is possible by increasing the degree of crystallinity in the layer HTL1 in a period from starting a deposition of the layer HTL1 to starting a deposition of the layer HTL2. The degree of crystallinity in the layer HTL1 can be increased, for example, by subjecting the layer HTL1 to an appropriate heat treatment.

Examples of the present invention will be described below.

EXAMPLE 1

In this example, the organic EL display described with reference to FIGS. 1 to 3 was manufactured by the following method.

First, the undercoat layer UC, insulating partition layer PI, and components interposed therebetween were formed on the insulating substrate SUB. A glass substrate was used as the substrate SUB, and ITO was used for the pixel electrodes PE, i.e., anodes AND.

Next, the hole injection layer HIL and layer HTL1 were formed by vacuum evaporation on the anode AND in this order. CuPc was used as the material of the hole injection layer HIL. TPD was used as the material of the layer HTL1, and the thickness $d_1$ of the layer HTL1 was set at 40 nm.

Subsequently, the layer HTL1 was subjected to a heat treatment. Specifically, the substrate SUB was heated to 150° C.

Then, the layer HTL2, emitting layer EMT, electron transporting layer ETL, electron injection layer EIL, and cathode CTD were formed by vacuum evaporation on the layer HTL1 in this order. TPD was used as the material of the layer HTL2, and the thickness of the HTL2 was set at 120 nm. $Alq_3$ doped with coumarin was used as the material of the emitting layer EMT, and the thickness of the emitting layer was set at 30 nm. $Alq_3$ was used as the material of the electron transporting layer, and the thickness of the electron transporting layer was set at 30 nm. LiF was used as the material of the electron injection layer EIL, and the thickness of the electron injection layer was set at 1 nm. Aluminum was used as the material of the cathode CTD, and the thickness of the cathode CTD was set at 200 nm.

Thus, the array substrate AS was completed.

Next, a flame-shaped adhesive layer to be used as the sealing layer SS was formed on the sealing substrate CS. Then, desiccants were adhered to the sealing substrate SS at positions inside the frame formed by the adhesive layer.

Subsequently, the array substrate AS and sealing substrate CS were bonded together in an inert gas atmosphere such that the cathode CTD and sealing substrate CS faced each other and the adhesive layer was interposed between the array substrate AS and sealing substrate. Thereafter, the adhesive layer was cured, so as to complete the organic EL display.

The luminance efficiency was evaluated for the organic EL display. As a result, the luminance efficiency was 4.2 cd/A when the density of current flowing through the organic EL element OLED was set at 10 mA/cm$^2$.

COMPARATIVE EXAMPLE 1

In this example, an organic EL display was manufactured by the same method as described in Example 1 except that the first layer HTL1 was omitted and the thickness $d_2$ of the second layer HTL2 was set at 160 nm.

The luminance efficiency was evaluated for the organic EL display. As a result, the luminance efficiency was 3.5 cd/A when the density of current flowing through the organic EL element OLED was set at 10 mA/cm$^2$.

EXAMPLE 2

In this example, the hole mobility $\mu_1$ and $\mu_2$ in the layers HTL1 and HTL2 formed in Example 1 was evaluated by the following method.

First, a glass substrate equal in material and thickness to the glass substrate used in Example 1 was prepared. An ITO layer was formed by sputtering on the glass substrate. The ITO layer was formed to have the same thickness as that of the anode formed in Example 1. Then, a TPD layer of 40 nm-thick was formed by vacuum evaporation on the ITO layer. Subsequently, the glass substrate was subjected to the same heat treat as that carried out in Example 1. Thereafter, an aluminum layer was formed by vacuum evaporation on the TPD layer. The aluminum layer was formed to have the same thickness as that of the cathode CTD formed in Example 1. Hereinafter, the test device thus obtained is referred to as "sample (1)".

Next, a test device was formed by the same method as described for the sample (1) except that the thickness of the TPD layer was set at 120 nm and the heat treatment for the TPD layer was omitted. Hereinafter, the test device thus obtained is referred to as "sample (2)".

The hole mobility in the TPD layer was evaluated for each of the samples (1) and (2) by time-of-flight method. As a result, the hole mobility in the TPD layer of the sample (1) was 2.0×10$^{-4}$ cm$^2$/V·s, and the hole mobility in the TPD layer of the sample (2) was 2.5×10$^{-3}$ cm$^2$/V·s. This result indicates that in the organic EL display manufactured in Example 1, the hole mobility $\mu_1$ in the layer HTL1 and the hole mobility $\mu_2$ in the layer HTL2 were 2.0×10$^{-4}$ cm$^2$/V·s and 2.5×10$^{-3}$ cm$^2$/V·s, respectively.

EXAMPLE 3

In this example, the structures of the layers HTL1 and HTL2 were checked by the following method.

First, a test device was manufactured by the same method as described for the sample (1) except that the aluminum layer was omitted. Hereinafter, the test device is to be referred as "sample (3)". A test device was also manufactured by the same method as described for the sample (2) except that the aluminum layer was omitted. Hereinafter, the test device is to be referred as "sample (4)".

Each TPD layer of the samples (3) and (4) was examined under a scanning electron microscope (SEM). As a result, fine cracks were observed on the TPD layer of the sample (3), and no crack was observed on the TPD layer of the sample (4).

Subsequently, the degrees of crystallinity in the TPD layer of the sample (3) and (4) were examined by X-ray diffractometer. As a result, the TPD layer of the sample (3) was lower in degrees of crystallinity than the TPD layer of the sample (4).

EXAMPLE 4

Figure 9:
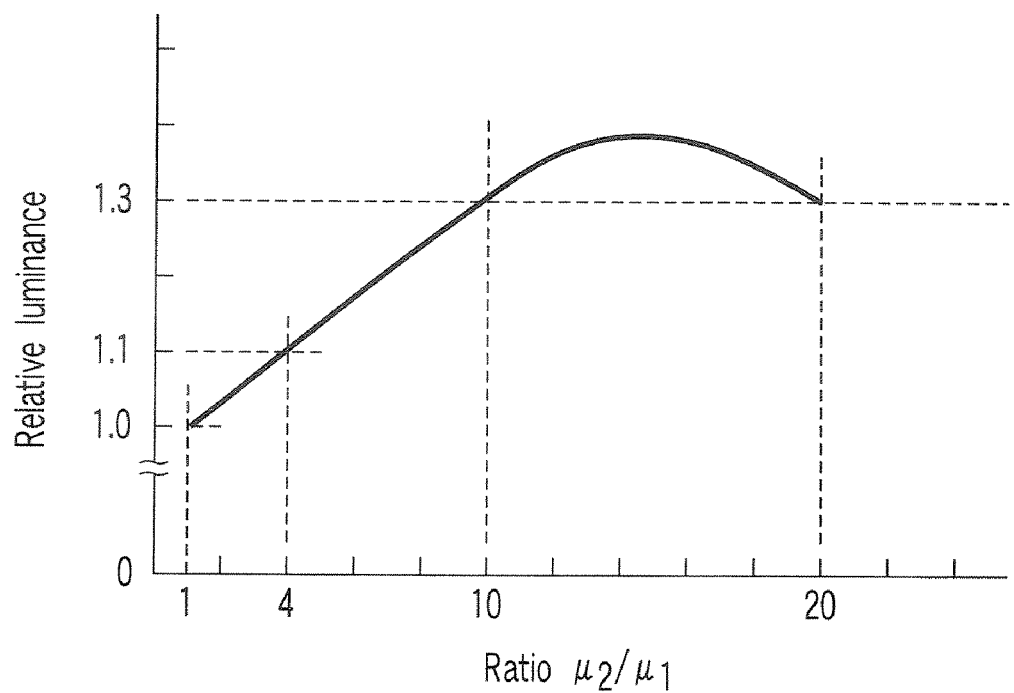
FIG. 9 is a graph showing an example of a relationship between luminance and hole mobility of a layer included in a hole transporting layer.

In this example, organic EL displays were manufactured by the same method as described in Example 1 except that the thicknesses $d_1$ and $d_2$ were set at 50 nm and 120 nm, respectively, and temperature and/or duration of the heat treatment was changed. The luminance efficiency was evaluated for each of the organic EL displays. The hole mobility $\mu_1$ in the layer HTL1 included in each organic EL display was also checked by the same method as described in Example 2. FIG. 9 shows the results.

FIG. 9 is a graph showing an example of a relationship between luminance and hole mobility of a layer included in a hole transporting layer. In FIG. 9 the abscissa denotes the ratio $\mu_2/\mu_1$, and the ordinate denotes a relative luminance assuming that the relative luminance is 1 when the ratio $\mu_2/\mu_1$ is 1. As shown in FIG. 9, within the range of the ratio $\mu_2/\mu_1$ from 1 to about 15, the relative luminance increased according to the increase of the ratio $\mu_2/\mu_1$, and within the range of the ratio $\mu_2/\mu_1$ from about 15 to 20, the relative luminance decreased according to the increase of the ratio $\mu_2/\mu_1$.

EXAMPLE 5

In this example, organic EL displays were manufactured by the same method as described in Example 1 except that temperature and/or duration of the heat treatment was changed and the ratio $d_2/d_1$ was also changed. Note that the sum of the thickness $d_1$ and the thickness $d_2$ was set at 160 nm in each of the organic EL displays.

Figure 10:
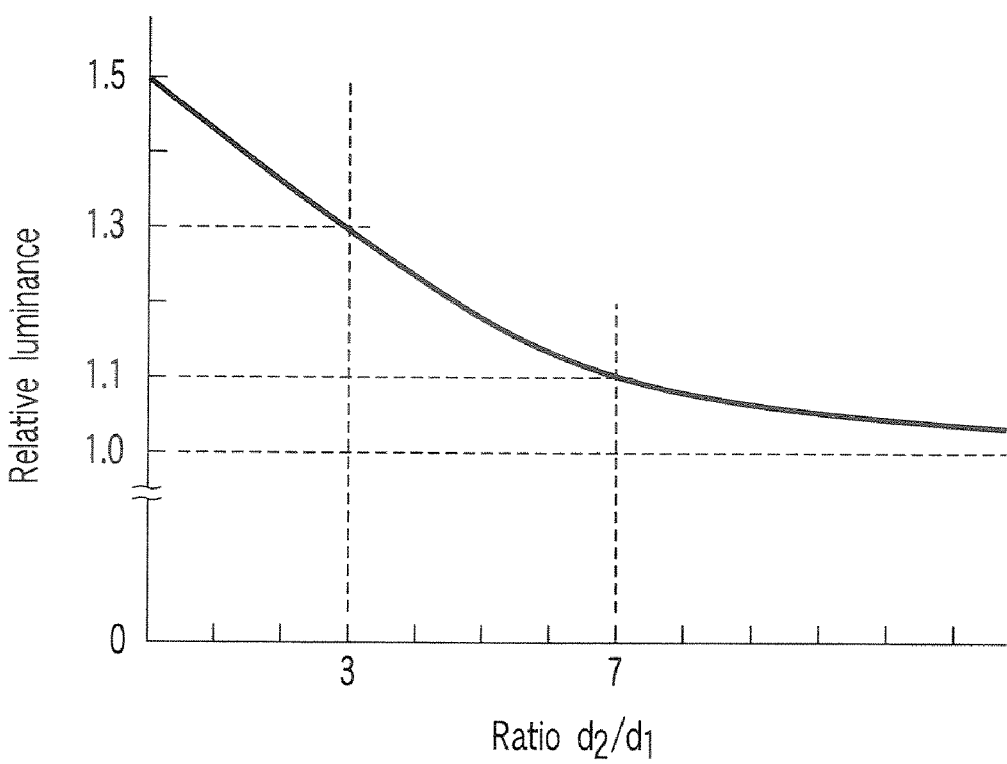
FIG. 10 is a graph showing an example of a relationship between luminance and thickness of a layer included in a hole transporting layer.

The hole mobility $\mu_1$ in the layer HTL1 included in each organic EL display was also checked by the same method as described in Example 2. As a result, the hole mobility $\mu_1$ was 4.0×10$^{-4}$ cm$^2$/V·s. The luminance efficiency when the density of current flowing through the organic EL element OLED was set at 10 mA/cm$^2$ was also evaluated for each of the organic EL displays. FIG. 10 shows the results.

FIG. 10 is a graph showing an example of a relationship between luminance and thickness of a layer included in a hole transporting layer. In FIG. 10 the abscissa denotes the ratio $\mu_2/\mu_1$, and the ordinate denotes a relative luminance assuming that the relative luminance is 1 when the ratio $\mu_2/\mu_1$ is infinity, i.e., when the layer HTL1 was omitted. As shown in FIG. 10, the relative luminance decreased according to the increase of the ratio $\mu_2/\mu_1$.

EXAMPLE 6

In this example, the organic EL display described with reference to FIGS. 4 to 8 was manufactured by the following method.

First, the undercoat layer UC, insulating partition layer PI, and components interposed therebetween were formed on the insulating substrate SUB. A glass substrate was used as the substrate SUB, and ITO was used for the pixel electrodes PE, i.e., anodes AND.

Next, the hole injection layer HIL and layer HTL1 were formed by vacuum evaporation on the anode AND in this order. CuPc was used as the material of the hole injection layer HIL. TPD was used as the material of the layer HTL1, and the thickness $d_1$ of the layer HTL1 was set at 40 nm.

Subsequently, the layer HTL1 was subjected to a heat treatment. Specifically, the substrate SUB was heated to 150° C.

Then, the layers HTL2 were formed by vacuum evaporation on the layer HTL1. TPD was used as the materials of the layers HTL2. The thickness $d_2$ of the HTL2 included in the pixel PX1 was set at 50 nm, the thickness $d_2$ of the HTL2 included in the pixel PX2 was set at 100 nm, and the thickness $d_2$ of the HTL2 included in the pixel PX3 was set at 120 nm.

Next, the emitting layers EMT were formed by vacuum evaporation on the layers HTL2. BH-120 doped with BD102 (both of them are manufactured by Idemitsu Kosan) was used as the material of the emitting layer EMT included in the pixel PX1, $Alq_3$ doped with coumarin was used as the material of the emitting layer EMT included in the pixel PX2, and $Alq_3$ doped with DCM was used as the material of the emitting layer EMT included in the pixel PX3. The thicknesses of the emitting layers EMT were set at 30 nm.

Subsequently, the electron transporting layer ETL, electron injection layer EIL, and cathode CTD were formed by vacuum evaporation on the emitting layers EMT in this order. $Alq_3$ was used as the material of the electron transporting layer, and the thickness of the electron transporting layer was set at 30 nm. LiF was used as the material of the electron injection layer EIL, and the thickness of the electron injection layer was set at 1 nm. Aluminum was used as the material of the cathode CTD, and the thickness of the cathode CTD was set at 200 nm.

Thus, the array substrate AS was completed.

Next, a flame-shaped adhesive layer to be used as the sealing layer SS was formed on the sealing substrate CS. Then, desiccants were adhered to the sealing substrate SS at positions inside the frame formed by the adhesive layer.

Subsequently, the array substrate AS and sealing substrate CS were bonded together in an inert gas atmosphere such that the cathode CTD and sealing substrate CS faced each other and the adhesive layer was interposed between the array substrate AS and sealing substrate. Thereafter, the adhesive layer was cured, so as to complete the organic EL display.

The luminance efficiency was evaluated for the organic EL display when a white image was displayed. As a result, the luminance efficiency was 4.2 cd/A when the density of current flowing through the organic EL element OLED was set at 10 $mA/cm^2$.

COMPARATIVE EXAMPLE 2

In this example, an organic EL display was manufactured by the same method as described in Example 6 except that the second layer HTL2 was omitted in each of pixels PX1 to PX3, the thickness $d_2$ of the second layer HTL2 in the pixel PX1 was set at 90 nm, the thickness $d_2$ of the second layer HTL2 in the pixel PX2 was set at 140 nm, and the thickness $d_2$ of the second layer HTL2 in the pixel PX3 was set at 160 nm.

The luminance efficiency was evaluated for the organic EL display when a white image was displayed under the same conditions as that in Example 6. As a result, the luminance efficiency was 3.0 cd/A when the density of current flowing through the organic EL element OLED was set at 10 $mA/cm^2$.

COMPARATIVE EXAMPLE 3

In this example, an organic EL display was manufactured by the same method as described in Example 6 except that the thicknesses $d_1$ and $d_2$ were set at 20 nm and 70 nm, respectively in the pixel PX1, the thicknesses $d_1$ and $d_2$ were set at 40 nm and 100 nm, respectively in the pixel PX2, and the thicknesses $d_1$ and $d_2$ were set at 20 nm and 70 nm, respectively in the pixel PX3.

The luminance efficiency was evaluated for the organic EL display when a white image was displayed under the same conditions as that in Example 6. As a result, the luminance efficiency was 3.5 cd/A when the density of current flowing through the organic EL element OLED was set at 10 $mA/cm^2$.

EXAMPLE 7

In this example, the hole mobility $\mu_1$ and $\mu_2$ in the layers HTL1 and HTL2 formed in Example 6 was evaluated by the following method.

First, a glass substrate equal in material and thickness to the glass substrate used in Example 6 was prepared. An ITO layer was formed by sputtering on the glass substrate. The ITO layer was formed to have the same thickness as that of the anode formed in Example 6. Then, a TPD layer of 40 nm-thick was formed by vacuum evaporation on the ITO layer. Subsequently, the glass substrate was subjected to the same heat treat as that carried out in Example 6. Thereafter, an aluminum layer was formed by vacuum evaporation on the TPD layer. The aluminum layer was formed to have the same thickness as that of the cathode CTD formed in Example 6. Hereinafter, the test device thus obtained is referred to as "sample (5)".

Next, a test device was formed by the same method as described for the sample (5) except that the thickness of the TPD layer was set at 120 nm and the heat treatment for the TPD layer was omitted. Hereinafter, the test device thus obtained is referred to as "sample (6)".

The hole mobility in the TPD layer was evaluated for each of the samples (5) and (6) by time-of-flight method. As a result, the hole mobility in the TPD layer of the sample (5) was $2.0 \times 10^{-4}$ $cm^2/V \cdot s$, and the hole mobility in the TPD layer of the sample (6) was $2.5 \times 10^{-3}$ $cm^2/V \cdot s$. This result indicates that in the organic EL display manufactured in Example 6, the hole mobility $\mu_1$ in the layer HTL1 and the hole mobility $\mu_2$ in the layer HTL2 were $2.0 \times 10^{-4}$ $cm^2/V \cdot s$ and $2.5 \times 10^{-3}$ $cm^2/V \cdot s$, respectively.

EXAMPLE 8

In this example, the structures of the layers HTL1 and HTL2 formed in Example 6 were checked by the following method.

First, a test device was manufactured by the same method as described for the sample (5) except that the aluminum layer was omitted. Hereinafter, the test device is to be referred as "sample (7)". A test device was also manufactured by the same method as described for the sample (6) except that the aluminum layer was omitted. Hereinafter, the test device is to be referred as "sample (8)".

Each TPD layer of the samples (7) and (8) was examined under a scanning electron microscope (SEM). As a result, fine cracks were observed on the TPD layer of the sample (7), and no crack was observed on the TPD layer of the sample (8).

Subsequently, the degrees of crystallinity in the TPD layer of the sample (7) and (8) were examined by X-ray diffractometer. As a result, the TPD layer of the sample (7) was higher in degrees of crystallinity than the TPD layer of the sample (8).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic EL display comprising:
   a substrate; and
   organic EL elements arranged on the substrate, each of the organic EL elements comprising an anode, a cathode, an emitting layer made of an organic material and interposed between the anode and the cathode, and a hole transporting layer made of an organic material and interposed between the emitting layer and the anode, the hole transporting layer including a first layer and a second layer facing the substrate with the first layer interposed therebetween, and the second layer being equal in compositions with the first layer and different in degrees of crystallinity from the first layer.

2. The display according to claim 1, wherein the first layer is lower in degrees of crystallinity than the second layer.

3. The display according to claim 1, wherein a thickness $d_1$ of the first layer is smaller than a thickness $d_2$ of the second layer.

4. The display according to claim 3, wherein a ratio $d_2/d_1$ of the thickness $d_2$ to the thickness $d_1$ is equal to or less than 7.

5. The display according to claim 1, wherein the organic EL elements includes first to third organic EL elements differing in emitting colors from one another, the first to third organic EL elements being different in thickness of the hole transporting layer from one another and equal in thickness of the first layer to one another.

6. The display according to claim 5, wherein the first to third organic EL elements are equal in compositions and degrees of crystallinity of the first layer and compositions and degrees of crystallinity of the second layer to one another, and the first and second layers are different in degrees of crystallinity from each other in each of the first to third organic EL elements.

7. An organic EL display comprising:
   a substrate; and
   organic EL elements arranged on the substrate, each of the organic EL elements comprising an anode, a cathode, an emitting layer made of an organic material and interposed between the anode and the cathode, and a hole transporting layer made of an organic material and interposed between the emitting layer and the anode, the hole transporting layer including a first layer and a second layer facing the substrate with the first layer interposed therebetween, and the second layer being equal in compositions with the first layer and different in hole mobility from the first layer.

8. The display according to claim 7, wherein hole mobility $\mu_1$ of the first layer is lower than hole mobility $\mu_2$ of the second layer.

9. The display according to claim 8, wherein a ratio $\mu_2/\mu_1$ of the hole mobility $\mu_2$ to the hole mobility $\mu_1$ falls within a range from 4 to 20.

10. The display according to claim 7, wherein a thickness $d_1$ of the first layer is smaller than a thickness $d_2$ of the second layer.

11. The display according to claim 10, wherein a ratio $d_2/d_1$ of the thickness $d_2$ to the thickness $d_1$ is equal to or less than 7.

12. The display according to claim 7, wherein the organic EL elements includes first to third organic EL elements differing in emitting colors from one another, the first to third organic EL elements being different in thickness of the hole transporting layer from one another and equal in thickness of the first layer to one another.

13. The display according to claim 12, wherein the first to third organic EL elements are equal in compositions and degrees of crystallinity of the first layer and compositions and degrees of crystallinity of the second layer to one another, and the first and second layers are different in degrees of crystallinity from each other in each of the first to third organic EL elements.

14. A method of manufacturing the organic EL display according to claim 1, comprising:
    in a period from starting a deposition of the first layer to starting a deposition of the second layer, decreasing a degree of crystallinity in the first layer.

15. The method according to claim 14, wherein the degree of crystallinity is decreased by expanding and contracting the substrate in an in-plane direction parallel to a main surface of the substrate.

16. The method according to claim 15, wherein expanding and contracting the substrate is carried out by subjecting the substrate to a heat treatment.

17. The method according to claim 14, wherein the first and second layers are equal in compositions to each other.

18. The method according to claim 14, wherein the first layer is made to have a degree of crystallinity lower than that of the second layer.

19. A method of manufacturing the organic EL display according to claim 1, comprising:
    in a period from starting a deposition of the first layer to starting a deposition of the second layer, expanding and contracting the substrate in an in-plane direction parallel to a main surface of the substrate or subjecting the substrate to a heat treatment.

20. The method according to claim 19, wherein the substrate is expanded and contracted in the in-plane direction.

21. The method according to claim 19, wherein the substrate is subjected to the heat treatment.

* * * * *